(12) United States Patent
Steinberg et al.

(10) Patent No.: US 7,416,819 B2
(45) Date of Patent: Aug. 26, 2008

(54) TEST MASK FOR OPTICAL AND ELECTRON OPTICAL SYSTEMS

(75) Inventors: Walter Steinberg, Weilmuenster-Moettau (DE); Gerhard Schlueter, Wilnsdorf (DE); Michael Ferber, Wetzlar (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 272 days.

(21) Appl. No.: 11/424,500

(22) Filed: Jun. 15, 2006

(65) Prior Publication Data

US 2007/0031739 A1    Feb. 8, 2007

Related U.S. Application Data

(60) Provisional application No. 60/704,865, filed on Aug. 2, 2005.

(51) Int. Cl.
*G03F 9/00* (2006.01)

(52) U.S. Cl. .................. 430/5; 430/30; 257/48
(58) Field of Classification Search .............. 430/5, 430/30; 257/48
See application file for complete search history.

(56) References Cited

U.S. PATENT DOCUMENTS

| | | | | |
|---|---|---|---|---|
| 6,214,494 | B1 * | 4/2001 | Bula et al. | 430/5 |
| 7,175,945 | B2 * | 2/2007 | Mieher et al. | 430/5 |
| 7,266,800 | B2 * | 9/2007 | Sezginer | 716/21 |

* cited by examiner

*Primary Examiner*—Christopher G Young
(74) *Attorney, Agent, or Firm*—Houston Eliseeva LLP

(57) ABSTRACT

A test mask 1 for microscopy is disclosed, which is formed on a substrate of quartz. The test mask 1 comprises a multiplicity of sub-masks 4, which are implemented such that each sub-mask 4 comprises structures which differ within a sub-mask 4 with regard to form and size. In addition, the structures of the individual sub-masks 4 are designed for optical or particle optical measurements according to size.

32 Claims, 14 Drawing Sheets

TEST MASK FOR OPTICAL AND ELECTRON OPTICAL SYSTEMS

RELATED APPLICATIONS

This application claims benefit to provisional application Ser. No. 60/704,865 filed on Aug. 2, 2005, which is incorporated herein by reference in its entirety.

FIELD OF THE INVENTION

The invention relates to a test mask for microscopy. In particular, the invention relates to a test mask for microscopy that is applied to a substrate.

BACKGROUND OF THE INVENTION

Different test masks have hitherto been used with different measurement systems (optical, particle optical). Here, a mask with larger structures was used with optical measurement systems. A mask that applied smaller structures was used with electron optical or particle optical measuring systems.

SUMMARY OF THE INVENTION

The task underlying the invention is to create a test mask that is suitable for optical as well as for electron optical and particle optical measurement systems.

The objective task is solved by a test mask that exhibits the characteristics in patent claim 1.

The invention has the advantage that the test mask comprises a multiplicity of sub-masks. Each sub-mask is provided with structures, which differ with regard to their form and their size. The sub-masks are formed such that they are suitable for optical or particle optical measurements, depending on size.

The substrate of the test mask consists of glass and is coated with a chromium film. The structures may be utilized in the same form with masks such as a resist mask (exposed and developed photoresist), a chromium-coated glass or quartz glass substrate [ADI=after development inspection]), an etched but not yet stripped mask [AEI=after etch inspection], a semi-transparent MoSi mask, a chromeless mask, an EUV mask, or a comparable mask. A mask with chromium on quartz glass was selected for the concrete embodiment of the present invention. The different structures are formed by etching. In some of the sub-masks, these are present in positive and in negative. The sub-masks are placed in a two-dimensional matrix arrangement.

The sub-masks are comprised of a first set and a second set. The first set of sub-masks differs from the second set of sub-masks with regard to size. In the embodiment of the invention described here, the first set of sub-masks has a side length that is 10 times larger than that of the second set of sub-masks. A person skilled in the art understands that the side ratio between the first and the second set of sub-masks may be something other than 10. Each sub-mask is formed with a central cross, which is formed by etching the chromium layer, and which is to be allocated to the first set of sub-masks.

This first set of sub-masks has a side length of approximately 500 µm, and the second set of sub-masks exhibits a side length of approximately 50 µm.

The first set of sub-masks comprises several structures, which are formed by etching the chromium layer. One structure is a cross that is arranged centrally within a square having a side length of 500 µm. The inverse structure of the cross also exists, that is, the cross is formed from a chromium layer, and the rest of the chromium layer is removed. A further structure consists of squares, which are also arranged within a square having a side length of 500 µm. The squares decrease in size along a line. Likewise, the squares are rotated by 45°, such that they stand on their corners. The inverse of this image also exists. A further possible structure is a multiplicity of parallel lines, which are arranged centrally within a square having a side length of 500 µm. The distance between the lines decreases toward the center. A central line has a length twice that of the other lines, which are arranged in parallel. These centrally arranged lines are rotated by 90° within a suitable structure. In a further structure, several squares are arranged within a square having a side length of 500 µm. The squares are created by removing the chromium layer. The individual squares are separated from each other by grid lines in the chromium layer. The inverse of this structure also exists. The squares consist of a chromium layer and are separated from each other by lines without a chromium layer. In a further structure, a square is arranged centrally within a square, which also has a side length of 500 µm. The square is formed from chromium layer and is separated from the rest of the chromium layer of the square by a perimeter line that is free of chromium. The centrally arranged square has a side length of 4 µm, and the perimeter line that is free of chromium has a width of 2 µm. The inverse of this structure also exists.

The second set of sub-masks also comprises several different structures. In one, several lines, which are formed by etching the chromium layer, are arranged radially. The radially arranged lines are arranged centrally within a square having a side length of 50 µm. The inverse of this structure also exists. A further structure is formed by two diagonally running lines, which intersect each other. The lines are formed by etching the chromium layer and are arranged centrally within a square having a side length of 50 µm. The inverse of this structure also exists. In a further structure, several small squares are arranged centrally in the form of a matrix. The squares are created by removing the chromium layer. The squares are arranged within a square having a side length of 50 µm. The inverse of this structure also exists.

A further structure is a single, centrally arranged square, which is created by etching away the chromium layer. This centrally arranged square is also arranged within a square having a side length of 50 µm. The inverse of this structure also exists. A further structure is a centrally arranged cross within a square having a side length of 50 µm. The lines of the cross are created by etching away the chromium layer. The inverse of this structure also exists. Finally, several parallel lines are provided, which are also formed by etching away the chromium layer. The lines run from one side of the square having a side length of 50 µm to the opposite side. Here, too, a structure exists in which the lines are rotated by 90°.

Further advantageous embodiments of the invention are described in the subclaims.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

The object of the invention is schematically represented in the diagram, and is described below on the basis of figures, wherein elements that have the same function are given the same reference numbers. They show.

DETAILED DESCRIPTION OF THE PREFERRED EMBODIMENTS

While this invention has been particularly shown and described with references to preferred embodiments thereof, it will be understood by those skilled in the art that various changes in form and details may be made therein without departing from the scope of the invention encompassed by the appended claims.

Figure 1:
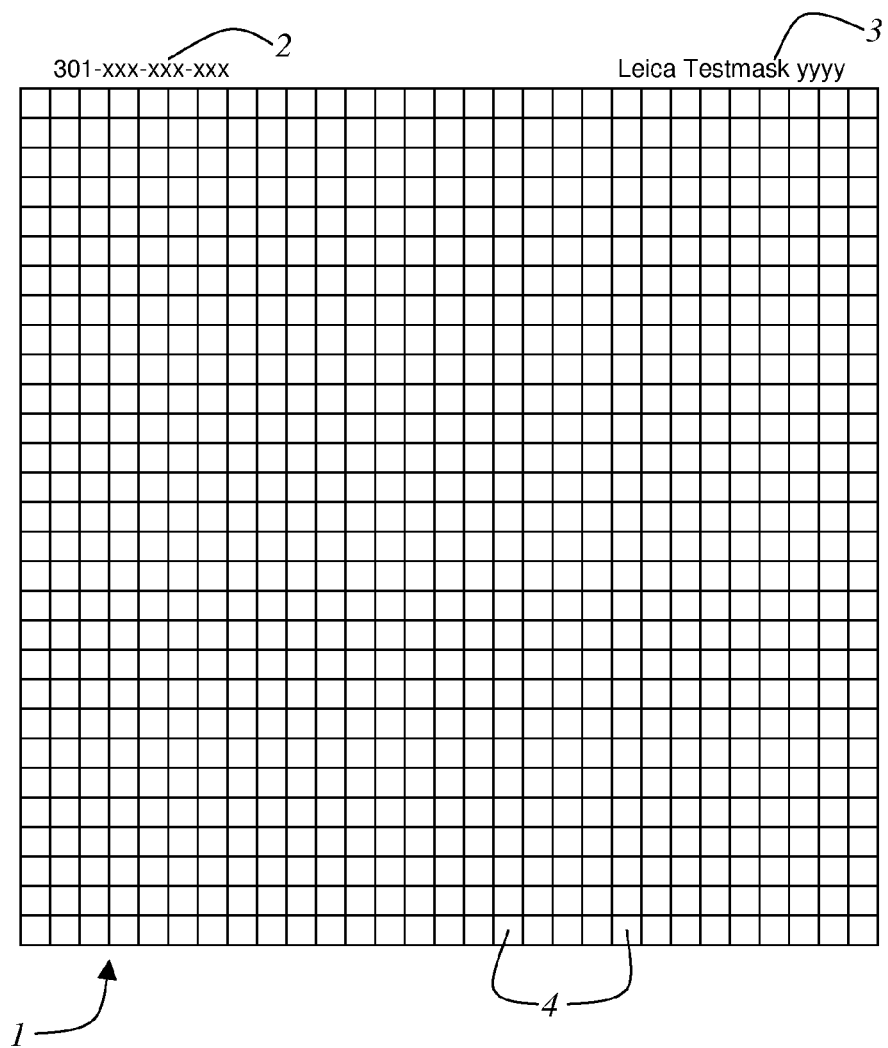
FIG. 1 shows a schematic view of a mask on which several sub-masks are arranged in a matrix arrangement.

FIG. 1 shows a schematic representation of a test mask 1. The test mask 1 exhibits a parts number 2 and is also provided with a product name 3. Several sub-masks 4 or dies are arranged in the form of a matrix on the test mask. The embodiment of the test mask 1 represented in FIG. 1 exhibits a square form and has a side length of 150 mm. 29 sub-masks 4 are arranged in each column and on each line. The substrate of the test mask 1 is quartz. The dimensions and ratios of the individual dimensions to each other given in the description are simply to be understood as guide values. A person skilled in the art understands how to select dimensions such that the individual sub-masks are suitable for optical and/or electron-optical testing.

Figure 2A:
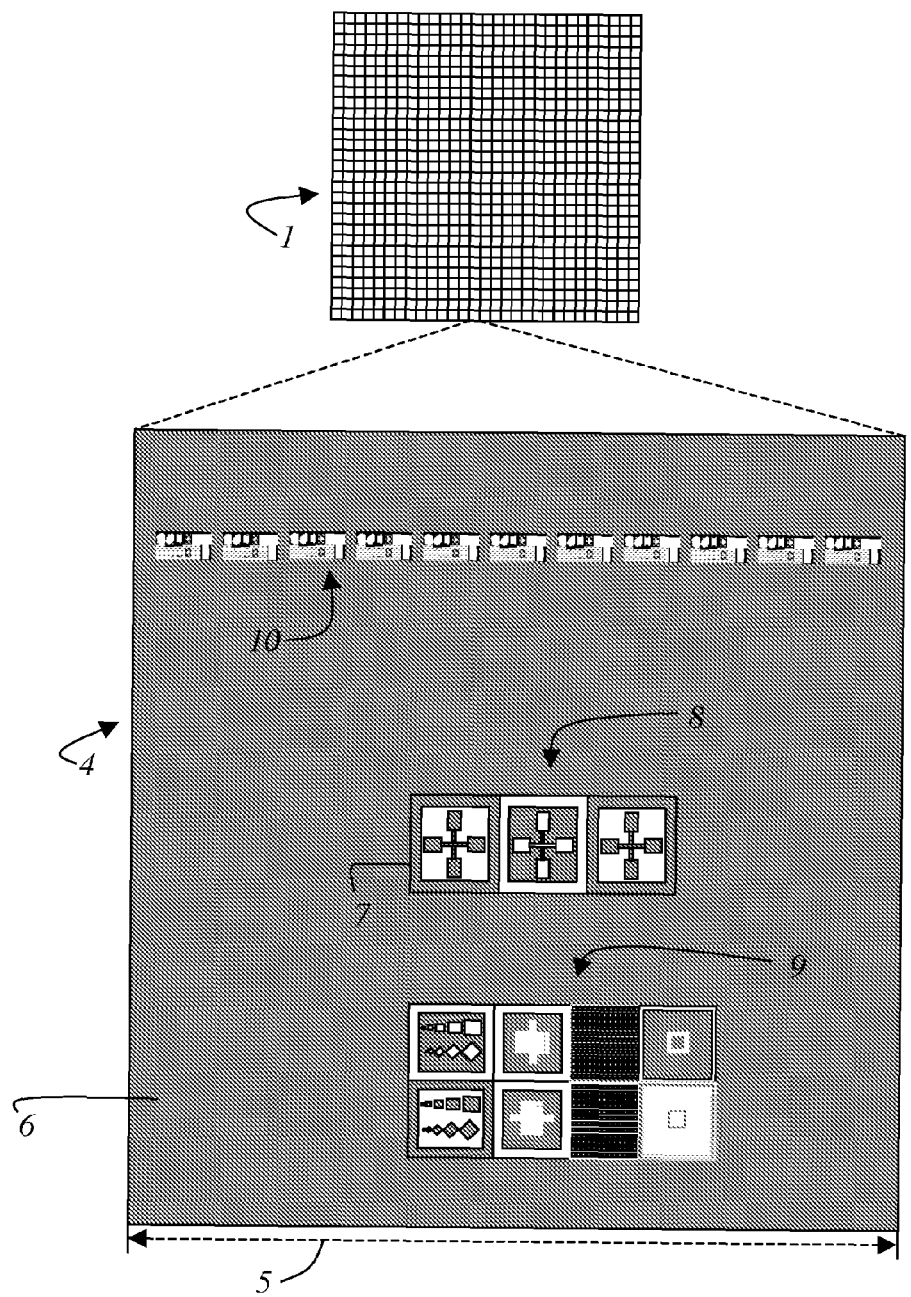
FIG. 2a shows an enlarged representation of a sub-mask arranged on the test mask.

FIG. 2a shows an enlarged representation of a sub-masks 4 applied to a test mask 1. Each sub-mask exhibits a side length 5 of 5 mm. In the representation of the test mask shown in FIG. 2, and in all following representations, the chromium layer 6 that is applied to the test mask is shown in dark. These structures are labeled with reference number 7. A cross, which belongs to a first set of sub-masks, is arranged centrally on the sub-mask 4. The cross is applied as an inverse cross to the sub-mask 4 to the left and to the right of the cross of the first set of sub-masks. A further group 9 of a first set of sub-masks is applied to the sub-mask. In addition to the first set of sub-masks, several groups 10 of a second set of sub-masks is arranged on the sub-mask 4.

Figure 2B:
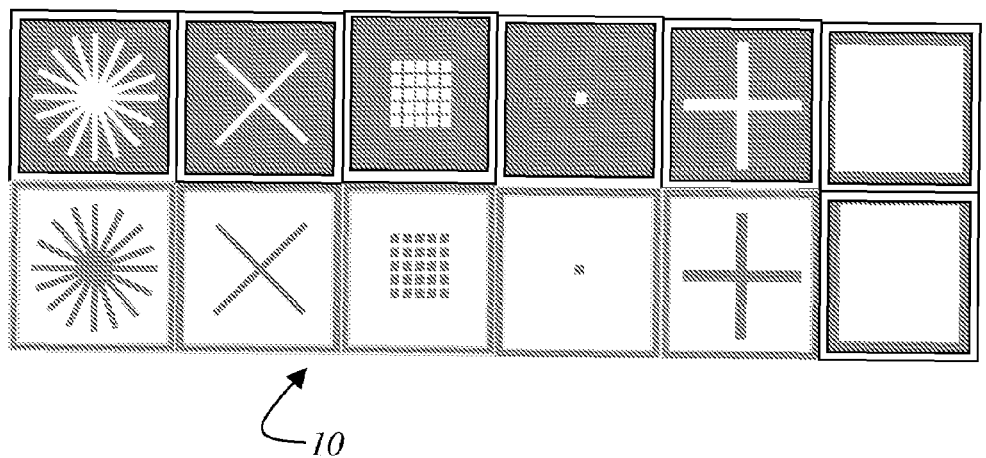
FIG. 2b shows a schematic view of a second set of sub-masks as they are present within each of the sub-masks.

FIG. 2b shows a group 10 of the second set of sub-masks. It should be noted that each sub-mask of the second set exhibits a side length that is smaller by a factor of 10 than the side length of the second set of sub-masks.

Figure 3:
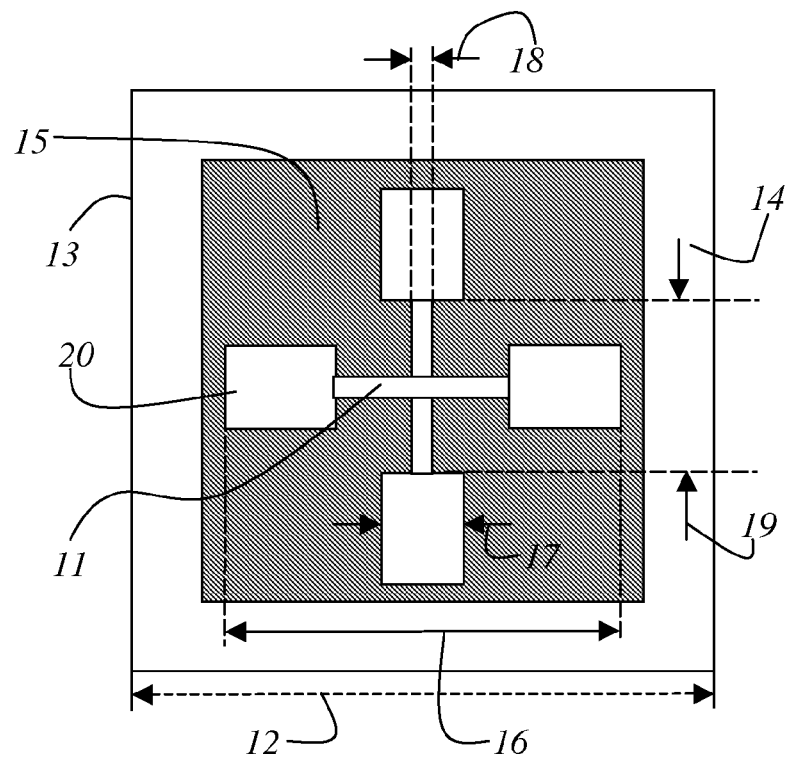
FIG. 3 shows a cross on a first set of sub-masks.
Figure 4:
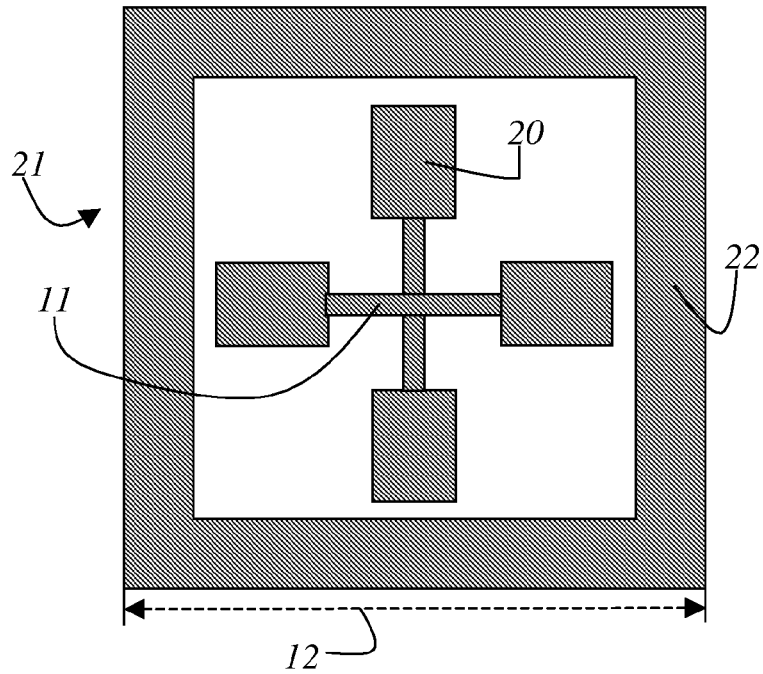
FIG. 4 shows the inverse structure of the structure represented in FIG. 3.

FIG. 3 shows a central cross 11, which is provided in each first set of sub-masks. The central cross is formed within a square having a side length 12 of 500 µm. The cross 11 represented in FIG. 3 is formed by etching away a chromium layer. The square 13 in which the cross 11 is formed has a perimeter border 14, which is also free of the chromium layer. The perimeter border 14 exhibits a thickness of 50 µm. The running numeration 15, which identifies the row and the column of the test mask 1 in which the sub-mask is located, is also structured on the sub-mask 13 with the cross 11. In the present example, the sub-mask 13 is located in the 18th row and the 25th column of the test mask 1. The central cross 11 exhibits a crossbar length 16 of approximately 200 µm. Each end region of a crossbar of the cross 11 is provided with a broad surface area 20. The surface area 20 has a width 17 of approximately 4 µm. The crossbars of the cross 11 have a width 18 of 1 µm. The distance between the broad surface areas 20 on the crossbars of the cross 11 is 10 µm FIG. 4 shows a structure 21, which is the inverse structure of the cross 11 in FIG. 3. The dimensions of the cross 11 in FIG. 4 correspond to the dimensions of the cross 11 in FIG. 3. The cross 11 in FIG. 4 is created by etching away the chromium layer around the cross 11. In the same way, a perimeter border 22 is formed around the square having a side length 12 of 500 µm by means of a chromium layer. The broad surface areas 20 shown in FIG. 3 and FIG. 4 at the ends of the crossbars of the cross 11 are used to test the measuring accuracy of optical systems. The crossbars of the cross 11 in FIGS. 3 and 4 are used to test the measuring accuracy of electron-optical or particle-optical systems. A particle-optical system or an electron-optical system is a CDSEM, i.e., a scanning electron microscope used to measure critical breadths of structures.

Figure 5:
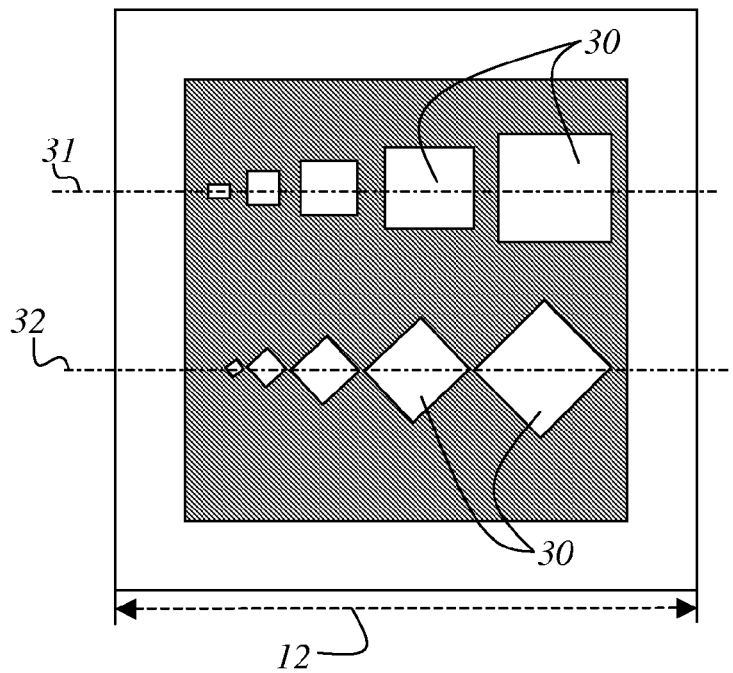
FIG. 5 shows the arrangement of several squares of descending size within a square having a side length of 500 µm.

FIG. 5 shows a further structure of the first set of sub-masks. Here, the first set of sub-masks is formed with numerous squares 30. The squares 30 are created by etching away the chromium layer around the squares 30. The squares 30 are arranged along a first line 31. In addition, the squares 30 are rotated by a 45° and are arranged along a second line 32. The squares 30, which are arranged along the first line 31 and along the second line 32 increase in size and surface area (viewed from left to right). The gradation of resolution of an optical system or of an electron-optical or particle-optical system can be determined by decreasing the size of the squares 30.

Figure 6:
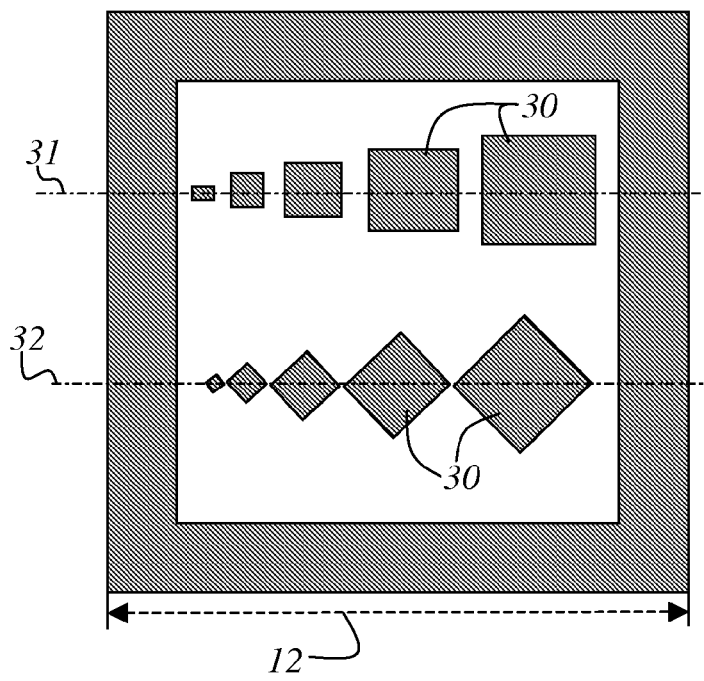
FIG. 6 shows the inverse structure of FIG. 5.

The squares 30 are structured within a square having a side length of 500 µm. FIG. 6 is the inverse representation of the structured squares 30 in FIG. 5. The squares 30 are thus surface areas of the chromium layer, and the chromium layer that surrounds the squares has been removed by etching away.

Figure 7:
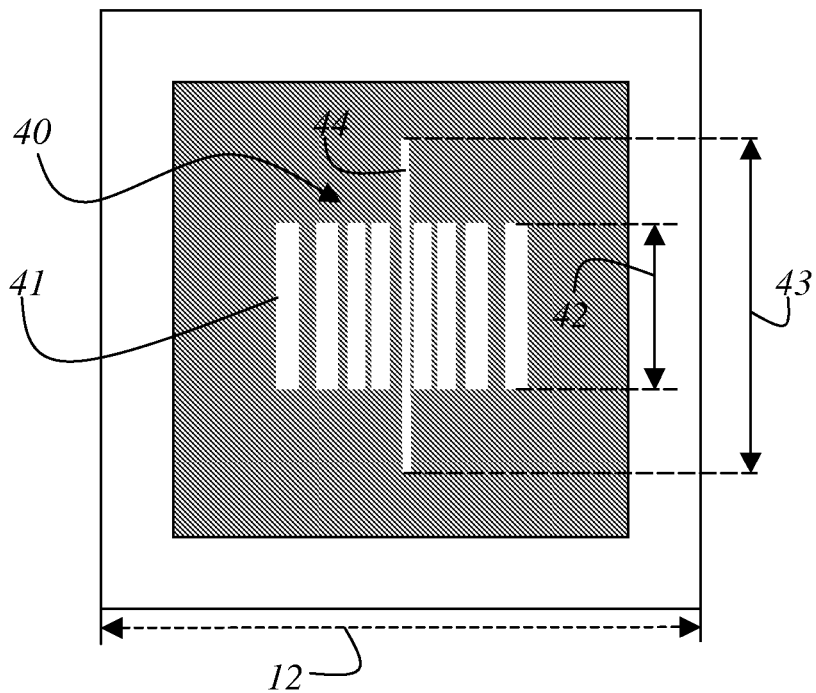
FIG. 7 shows parallel lines, which are arranged within a square having a side length of 500 µm, whereby a central line is double the length of the lines that are arranged in parallel.
Figure 8:
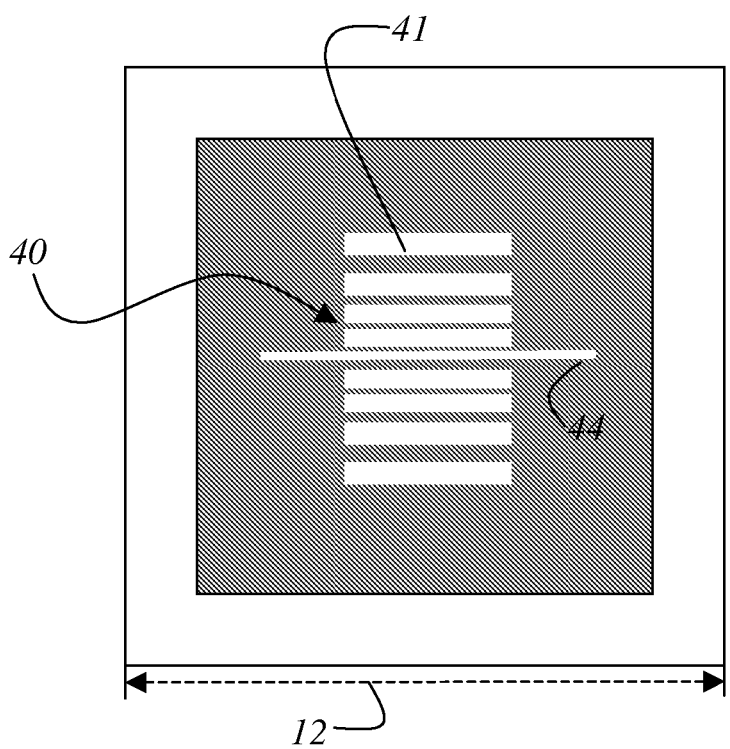
FIG. 8 shows the lines arranged in FIG. 7 rotated by 90°.

FIG. 7 shows a further first set of sub-masks in which the structure is realized within a square having a side length 12 of 500 µm. The structure is comprised of a first set 40 of centrally arranged lines 41. The lines 41 are parallel and decrease in distance from each other toward the center of the sub-mask. Furthermore, a central line 44 is formed, which exhibits a length that is double that of the other lines 41. The lines 41 exhibit a length 42 of 10 µm. The central line 44 has a length 43 of 20 µm. The lines 41 and the central line 44 are created by etching away the chromium layer. FIG. 8 shows a different arrangement of the lines 41 and the central lines 44 shown in FIG. 7. Here, the lines are rotated by 90° and structured in the same way in a chromium layer by etching. The long central line 44 is used to center an optical beam path. The structures represented in FIG. 7 and FIG. 8 are on the mask in order to detect spherical aberration in optical microscopes.

Figure 9:
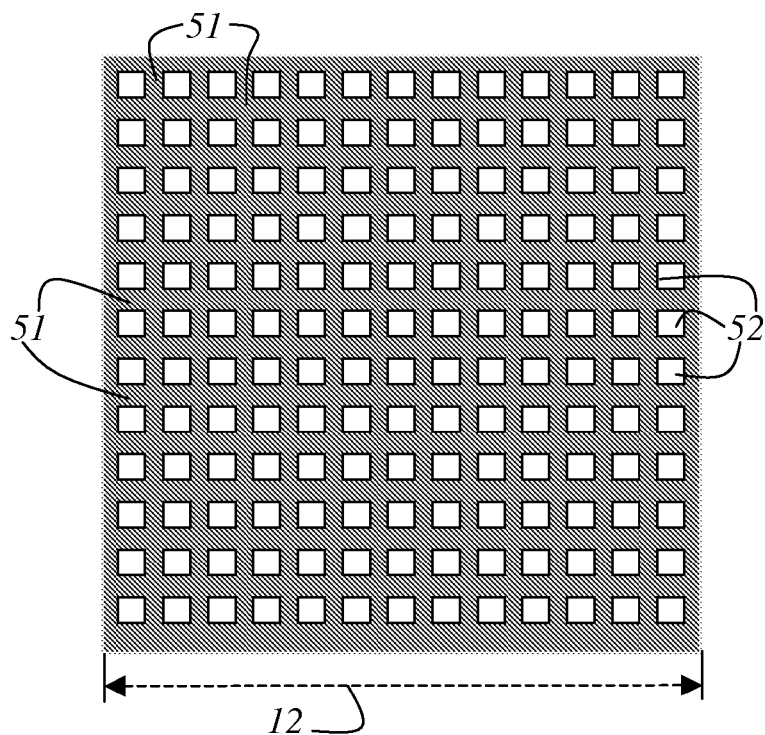
FIG. 9 shows several small squares, which are arranged in a matrix arrangement within a square having a side length of 500 µm.
Figure 10:
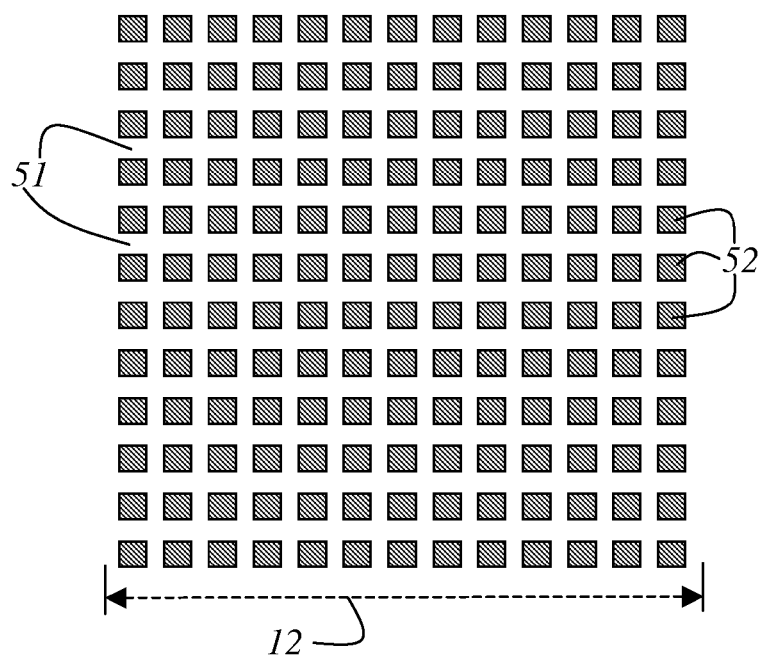
FIG. 10 shows the inverse structure of the structure in FIG. 9.

FIG. 9 also shows a first set of sub-masks, which is formed by a set of grid lines 51. The grid lines 51, which consist of chromium layer, are separated from each other by a multiplicity of squares 52. The squares 52 are created by etching away the chromium layer. The multiplicity of squares 52 is formed on a square having a side length of 500 µm. FIG. 10 shows the sub-mask represented in FIG. 9 in inverse form. Here, the grid lines 51 are free of chromium layer. Consequently, the squares 52 are comprised of chromium layer.

Figure 11:
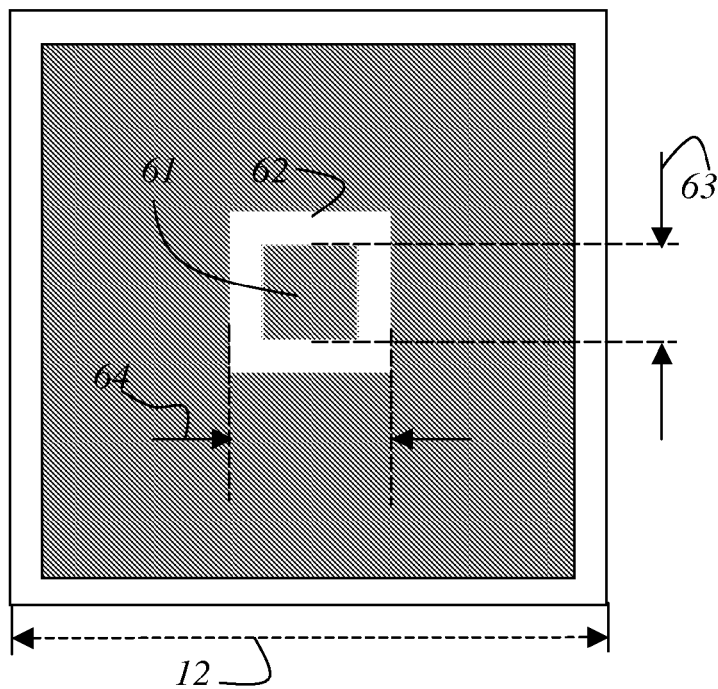
FIG. 11 shows a centrally arranged square, which is separated from the rest of the chromium layer by a perimeter line that is free of chromium layer.
Figure 12:
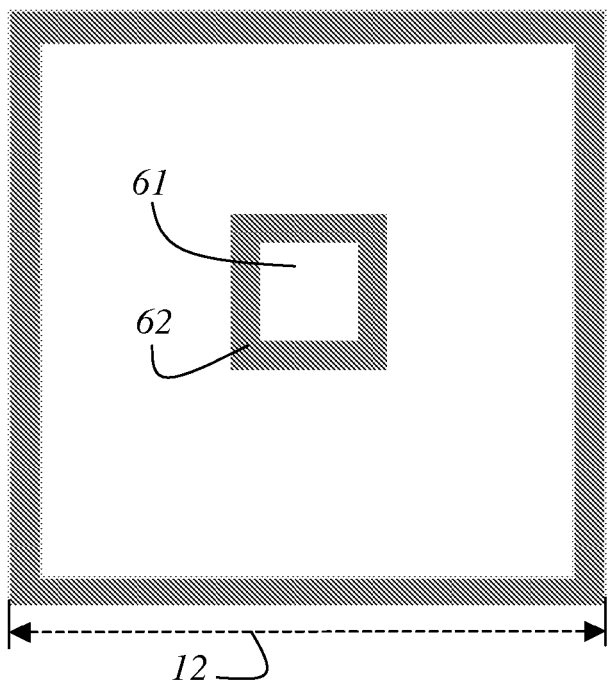
FIG. 12 shows the inverse structure of the structure represented in FIG. 11.

FIG. 11 shows a further first set of sub-masks, which comprises a square 61, which is formed in a chromium layer and comprises a chromium layer. The square 61 is surrounded by a perimeter line 62, which is formed by etching away the chromium layer. The rest of the sub-mask, which comprises a square having a side length 12 of 500 µm, remains covered with chromium layer. The square 61 has a side length of 4 µm, and the perimeter border has a side length 64 of 8 µm. FIG. 12 shows the square 61 represented in FIG. 11 in inverse form. Consequently, the square 61 is formed by etching away the chromium layer. Consequently, the perimeter line 62 is chromium layer. The structures represented in FIG. 11 and FIG. 12 are used to determine overlay (optical). By the same token, the structures are used to test algorithms to determine the overlay.

Figure 13:
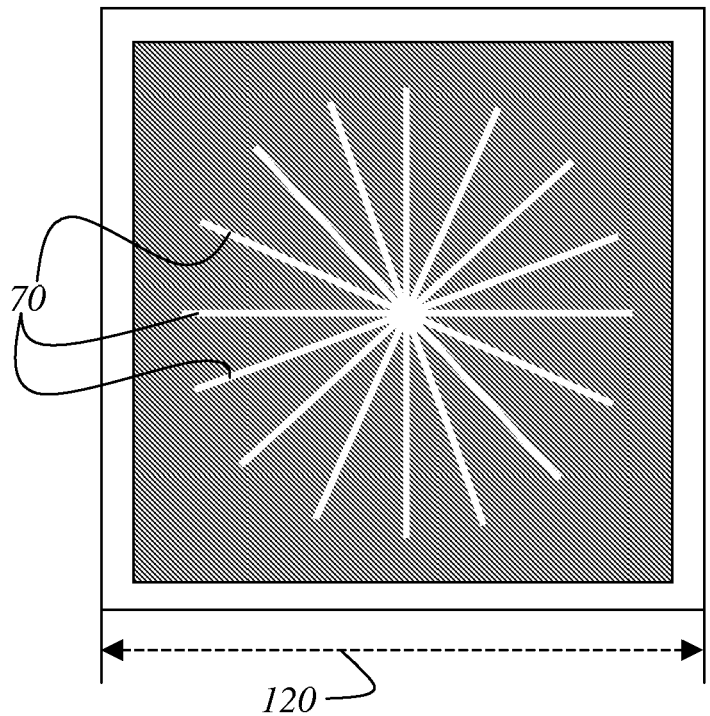
FIG. 13 shows several radially arranged lines, which are arranged centrally within a square having a side length of 50 µm.
Figure 14:
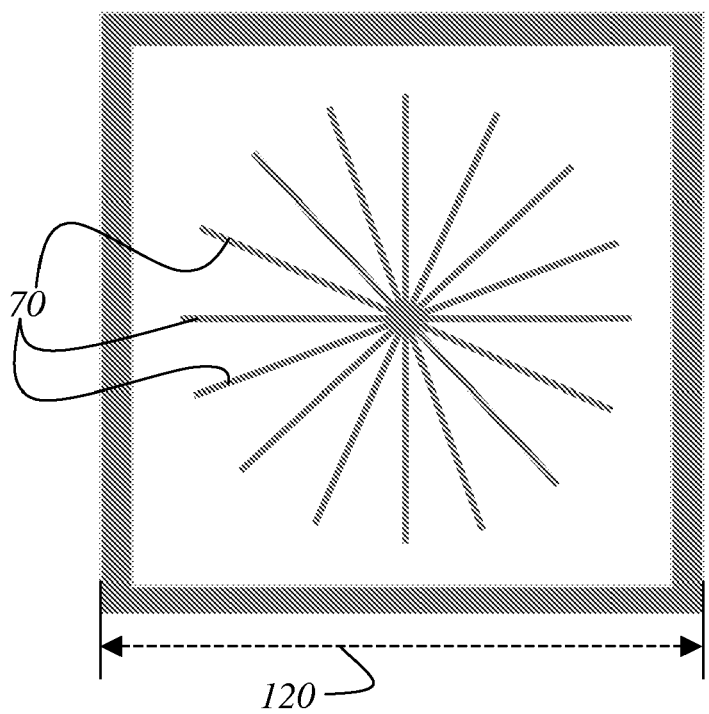
FIG. 14 shows the inverse structure of the structure represented in FIG. 13.

FIG. 13 shows a second set of sub-masks, in which the structures are formed in a chromium layer, which exhibits a side length 120 of 50 µm. As a first structure, several lines 70 are arranged radially in the chromium layer. In the structure represented in FIG. 13, the lines 70 are formed by etching away the chromium layer. FIG. 14 shows the negative representation of the structure represented in FIG. 13. The lines 70 are now represented as chromium layer. The structures represented in FIGS. 13 and 14 are used to determine the astigmatism of various focal positions. With structures or structure intervals, respectively, that are less than 0.2 µm, measurement is therefore done by CDSEM.

Figure 15:
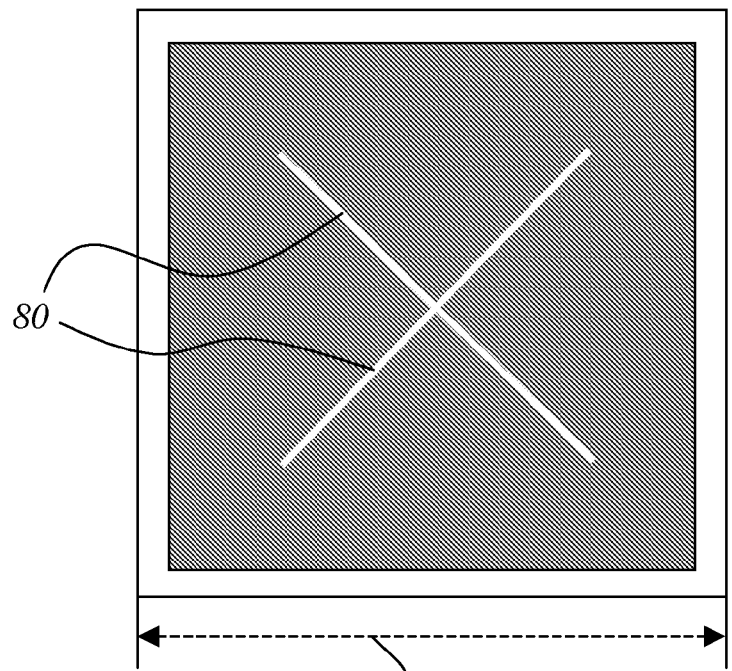
FIG. 15 shows two diagonally running lines, which are arranged within a square having a side length of 50 µm.
Figure 16:
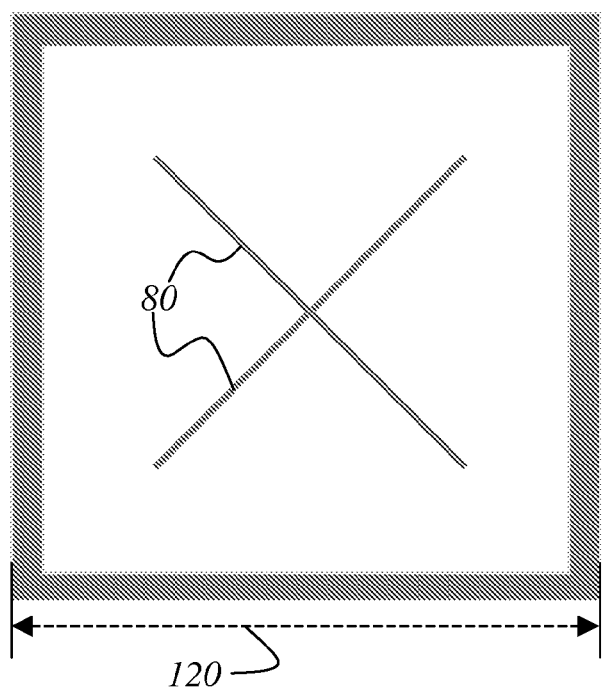
FIG. 16 shows the inverse structure of that in FIG. 15.

FIG. 15 shows a further second set of sub-masks, in which two diagonally arranged lines 80 are provided. The lines 80 are formed within a square having a side length of 50 µm. The lines 80 are created by etching away the chromium layer. FIG. 16 shows the inverse of the structure represented in FIG. 15.

Figure 17:
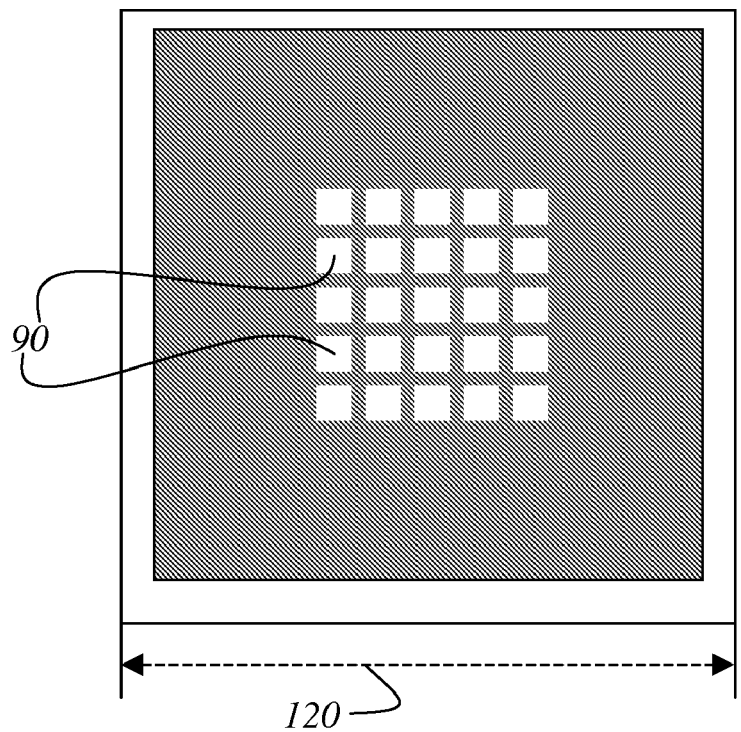
FIG. 17 shows several small squares, which are arranged centrally within a square having a side length of 50 µm.
Figure 18:
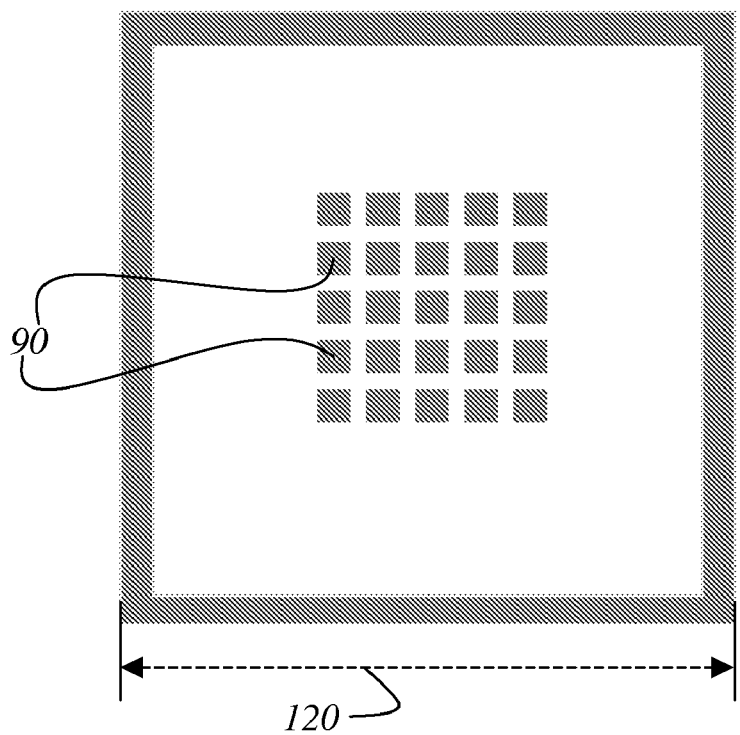
FIG. 18 shows the inverse structure of that in FIG. 17.

FIG. 17 shows a further set of sub-masks, in which several square points 90 are structured. The square points 90 are created by etching away the chromium layer. The square points 90 are arranged centrally within a square having a side length 120 of 50 µm. FIG. 18 shows the inverse of the structure in FIG. 17. Consequently, the squares 90 are comprised of chromium layer. The arrangement of dots (FIG. 18) and holes (FIG. 17) thus yields a tool with which the proximity effect of electron-optical or particle-optical systems may be determined.

Figure 19:
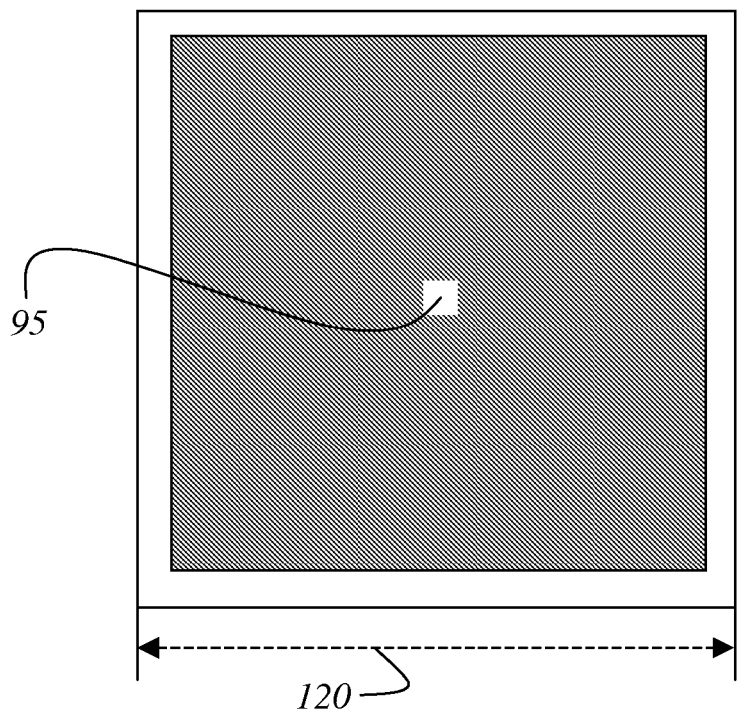
FIG. 19 shows a small central square, which is arranged within a square having a side length of 50 µm.
Figure 20:
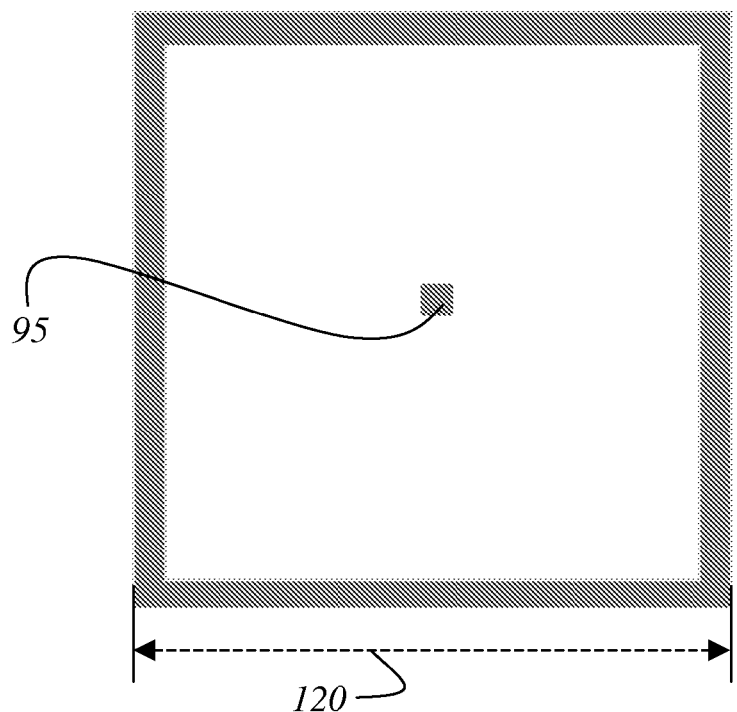
FIG. 20 shows the inverse structure of that in FIG. 19.

FIG. 19 shows a further embodiment of a second set of sub-masks. Here, a single square 95 is free of chromium layer. This square 95 is arranged centrally within a square having a side length 120 of 50 µm. FIG. 20 shows the inverse of the structure in FIG. 19. Consequently, the square 95 is formed of chromium layer, which is surrounded by a free area, which contains no chromium. The structures represented in FIG. 19 and FIG. 20 are also used to determine the proximity effect of electron-optical or particle-optical systems.

Figure 21:
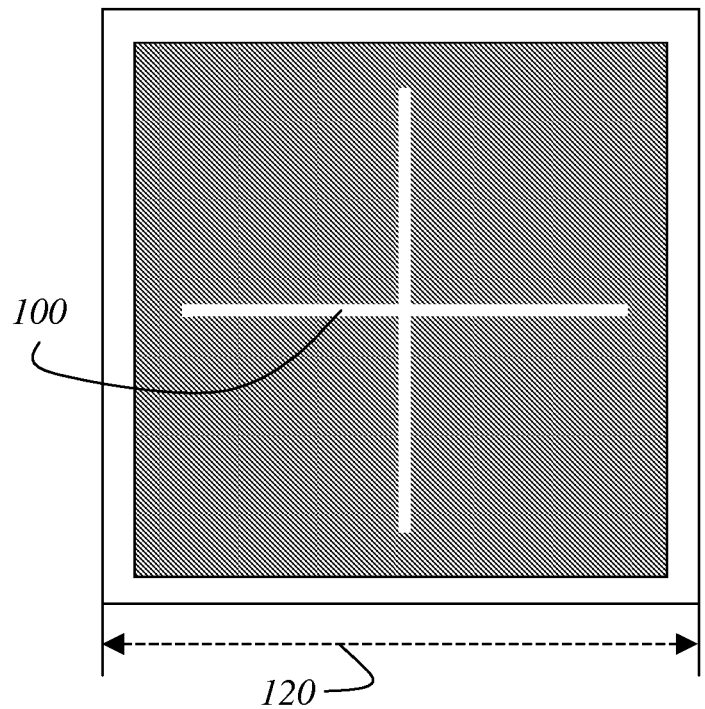
FIG. 21 shows a cross, which is arranged centrally within a square having a side length of 50 µm.
Figure 22:
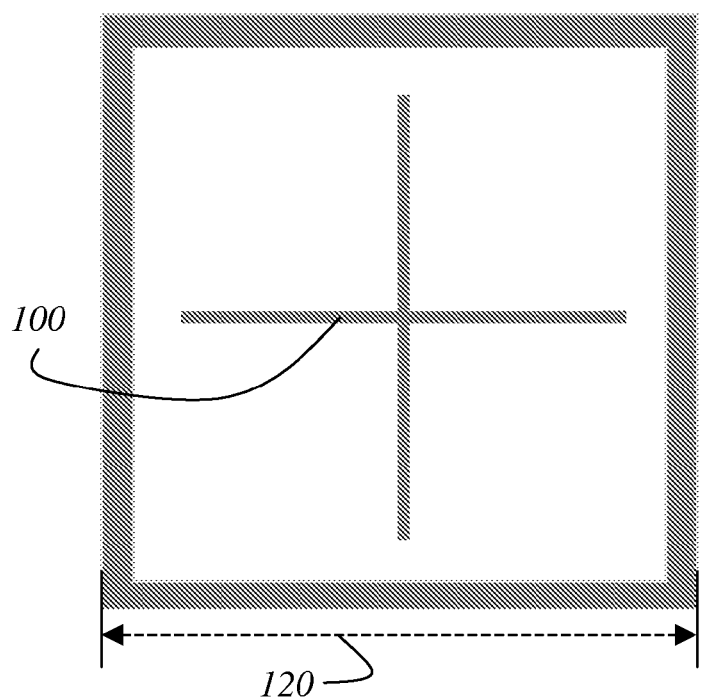
FIG. 22 shows the inverse structure of that in FIG. 21.

FIG. 21 shows a further embodiment of a second set of sub-masks, which is comprised of a cross 100, which is centrally arranged within a square having a side length 120 of 50 µm. The cross 100 is formed by etching away the chromium layer. FIG. 22 shows the inverse of the structure represented in FIG. 21. Consequently, the cross 100 is comprised of two chromium lines that intersect.

Figure 23:
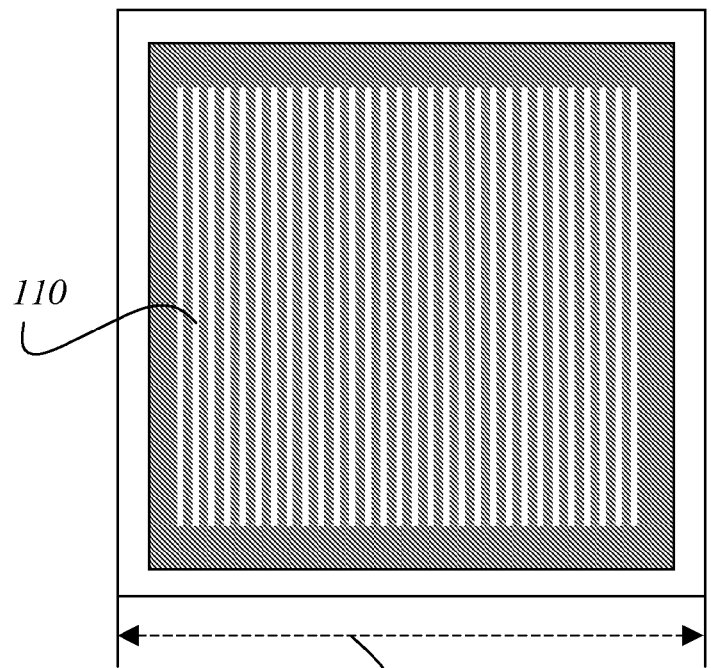
FIG. 23 shows several parallel lines that run from one side of a square having a side length of 50 µm to the opposite side of the square.
Figure 24:
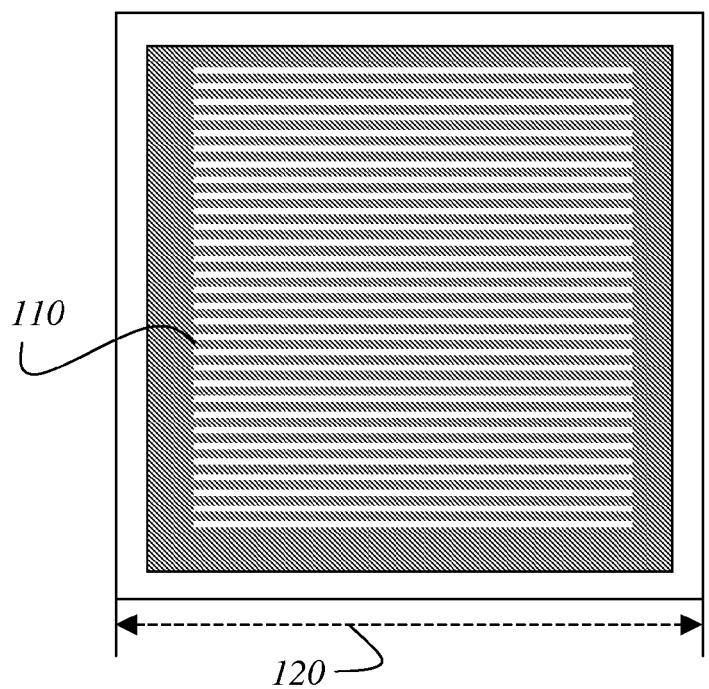
FIG. 24 shows the lines depicted in FIG. 23, whereby these are rotated by 90°.

FIG. 23 shows a multiplicity of lines 110, which are etched within a square having a side length 120 of 50 µm. FIG. 24, by contrast, shows this multiplicity of lines 110 rotated by 90°. Both of the structures represented in FIG. 23 and FIG. 24 are used to determine the field curvature of optical systems.

What is claimed is:

1. A test mask for microscopy is applied to a substrate, wherein the test mask comprises a multiplicity of sub-masks, whereby each sub-mask comprises structures, wherein the structures differ with regard to form and size within a sub-mask, and wherein the structures of the individual sub-masks are formed, according to size, for optical or particle-optical measurements.

2. Test mask according to claim 1, whereby the substrate of the test mask is comprised of glass, which is provided with a chromium layer, into which various structures are etched.

3. Test mask according to claim 1, whereby several of the sub-masks are present in positive and in negative on the substrate.

4. Test mask according to claim 1, whereby the sub-masks are placed in a two-dimensional matrix arrangement on the substrate.

5. Test mask according to claim 1, whereby the sub-masks are comprised of a first set and a second set, and whereby the first set of masks differs from the second set of masks with regard to size, and wherein the first set of sub-masks exhibits a side length that is greater by a factor of 10 than that of the second set of sub-masks.

6. Test mask according to claim 5, wherein the side length of the first set of sub-masks approximately corresponds to 500 µm, and wherein the side length of the second set of sub-masks approximately corresponds to 50 µm.

7. Test mask according to claim 5, whereby each sub-mask has a central cross, which is formed by etching away the chromium layer, and which is allocated to the first set of sub-masks.

8. Test mask according to claim 7, whereby the central cross has a crossbar length of 200 µm, wherein each end region of a crossbar is provided with a 4-µm-wide surface area, wherein the surface areas at each end region of the crossbar are at a distance of 10 µm, and wherein a 50-µm-wide frame surrounds the cross.

9. Test mask according to claim 8, whereby the central cross is bordered to the left and to the right by an inverse of the central cross.

10. Test mask according to claim 6, whereby each first set of sub-masks has squares, which are created by etching away the chromium layer.

11. Test mask according to claim 10, whereby the squares are arranged along a first line and along a second line, wherein the squares increase from left to right in surface area along the first line, and wherein the squares also increase from left to right in surface area along the second line and are rotated by 45°.

12. Test mask according to claim 6, whereby on each first set of sub-masks is formed a set of centrally arranged lines, which decrease with regard to width and distance toward a center, wherein a central line is formed, which exhibits double the length of the line, and wherein the centrally arranged lines are created by etching away the chromium layer.

13. Test mask according to claim 12, whereby the centrally arranged lines are rotated by 90°.

14. Test mask according to claim 12, whereby the centrally arranged lines exhibit a length of 10 µm.

15. Test mask according to claim 12, whereby the central line exhibits a length of 20 µm.

16. Test mask according to claim 6, whereby each first set of sub-masks is formed by a set of grid lines, whereby the grid lines are separated by squares, which are created by etching away the chromium layer.

17. Test mask according to claim 16, whereby each first set of sub-masks is formed by a set of grid lines, whereby the grid lines are created by etching away the chromium layer, and are separated by squares of chromium layer.

18. Test mask according to claim 6, whereby each first set of sub-masks comprises a square, which is formed from a chromium layer, which is separated from the remaining chromium layer by a peripheral etched line.

19. Test mask according to claim 18, whereby each first set of sub-masks comprises a square, which is formed from an etched chromium layer, which is separated from the remaining etched chromium layer by a peripheral line consisting of chromium.

20. Test mask according to one of claim 19, whereby the square has a side length of 5 µm, and wherein the peripheral line has a width of 2 µm.

21. Test mask according to claim 6, whereby each second set of sub-masks comprises radially arranged lines, which are formed from chromium layer by etching.

22. Test mask according to claim 21, whereby each second set of sub-masks comprises radially arranged lines of chromium, and wherein the remaining chromium layer is removed by etching it away.

23. Test mask according to claim 6, whereby each second set of sub-masks is comprised of two diagonally arranged lines, which are formed from chromium layer by etching away and are arranged centrally within a square, which comprises a chromium layer.

24. Test mask according to claim 23, whereby each second set of sub-masks is comprised of two diagonally arranged lines, which are comprised of chromium layer and are arranged centrally within a square, which is free of the chromium layer.

25. Test mask according to claim 6, whereby each second set of sub-masks is comprised of several square points, which are formed from a chromium layer by etching it away and are centrally arranged within a square, which comprises a chromium layer.

26. Test mask according to claim 25, whereby each second set of sub-masks comprises several square points, which are comprised of chromium layer and are centrally arranged within a square that is free of the chromium layer.

27. Test mask according to claim 6, whereby each second set of sub-masks comprises a single square point, which is formed by etching away chromium layer and is centrally arranged within a square, which comprises chromium layer.

28. Test mask according to claim 27, whereby each second set of sub-masks comprises a single square point, which comprises chromium layer and is centrally arranged within a square that is a free of the chromium layer.

29. Test mask according to claim 6, whereby each second set of sub-masks comprises two perpendicularly intersecting lines, which are formed by etching away chromium layer and are arranged centrally within a square that comprises chromium layer.

30. Test mask according to claim 29, whereby each second set of sub-masks comprises two perpendicularly intersecting lines, which are comprised of chromium layer and are arranged centrally within a square that is a free of the chromium layer.

31. Test mask according to claim 8, whereby each second set of sub-masks is comprised of several equidistant parallel lines, which are formed by etching away chromium layer.

32. Test mask according to claim 31, whereby each second set of sub-masks is comprised of several equidistant parallel lines, all of which are rotated by 90°.

* * * * *